United States Patent [19]

Hollis et al.

[11] Patent Number: 5,407,184
[45] Date of Patent: Apr. 18, 1995

[54] MECHANISM FOR ROTATING A WORKPIECE

[75] Inventors: Paul E. Hollis, Harrisburg; Edward N. Meyers, Hummelstown, both of Pa.

[73] Assignee: The Whitaker Corporation, Wilmington, Del.

[21] Appl. No.: 144,268

[22] Filed: Oct. 28, 1993

[51] Int. Cl.⁶ .............................................. B23Q 3/18
[52] U.S. Cl. ........................................ 269/60; 269/61; 269/71
[58] Field of Search .................. 414/222; 29/749, 751, 29/753, 959, 760, 861, 281.4, 33 M; 269/60, 61, 63, 71; 408/126; 74/89.15, 89.17; 476/67

[56] References Cited

U.S. PATENT DOCUMENTS

| 4,563,810 | 1/1986 | Adlon et al. | |
| 4,650,391 | 3/1987 | Adlon et al. | |
| 4,988,261 | 1/1991 | Blatt | 269/60 |
| 5,326,197 | 7/1994 | Takei | 476/67 |

Primary Examiner—Robert C. Watson
Attorney, Agent, or Firm—Robert J. Kapalka

[57] ABSTRACT

A mechanism for rotating a machine element and in particular for rotating a mandrel which holds a workpiece in a machine comprises a first frame member having a substantially linear road surface. A machine element is rotatably secured to a carrier on an axis extending transverse to the road surface. The machine element includes a wheel member having a substantially circular wheel surface adapted to engage the road surface, and may include a mandrel adapted to hold a workpiece. A first drive mechanism is operable for moving the carrier and the first frame member relatively together for engagement of the wheel surface with the road surface, and for moving or at least permitting movement of the carrier and the first frame member relatively apart for disengagement of the wheel surface from the road surface. A second drive mechanism is operable to produce relative movement of the carrier parallel to the road surface. Actuation of the second drive mechanism when the road surface is engaged with the wheel surface causes rotation of the machine element, and thereby rotates a workpiece held in a mandrel of the machine element. A method of rotating a workpiece in a machine is also disclosed.

14 Claims, 10 Drawing Sheets

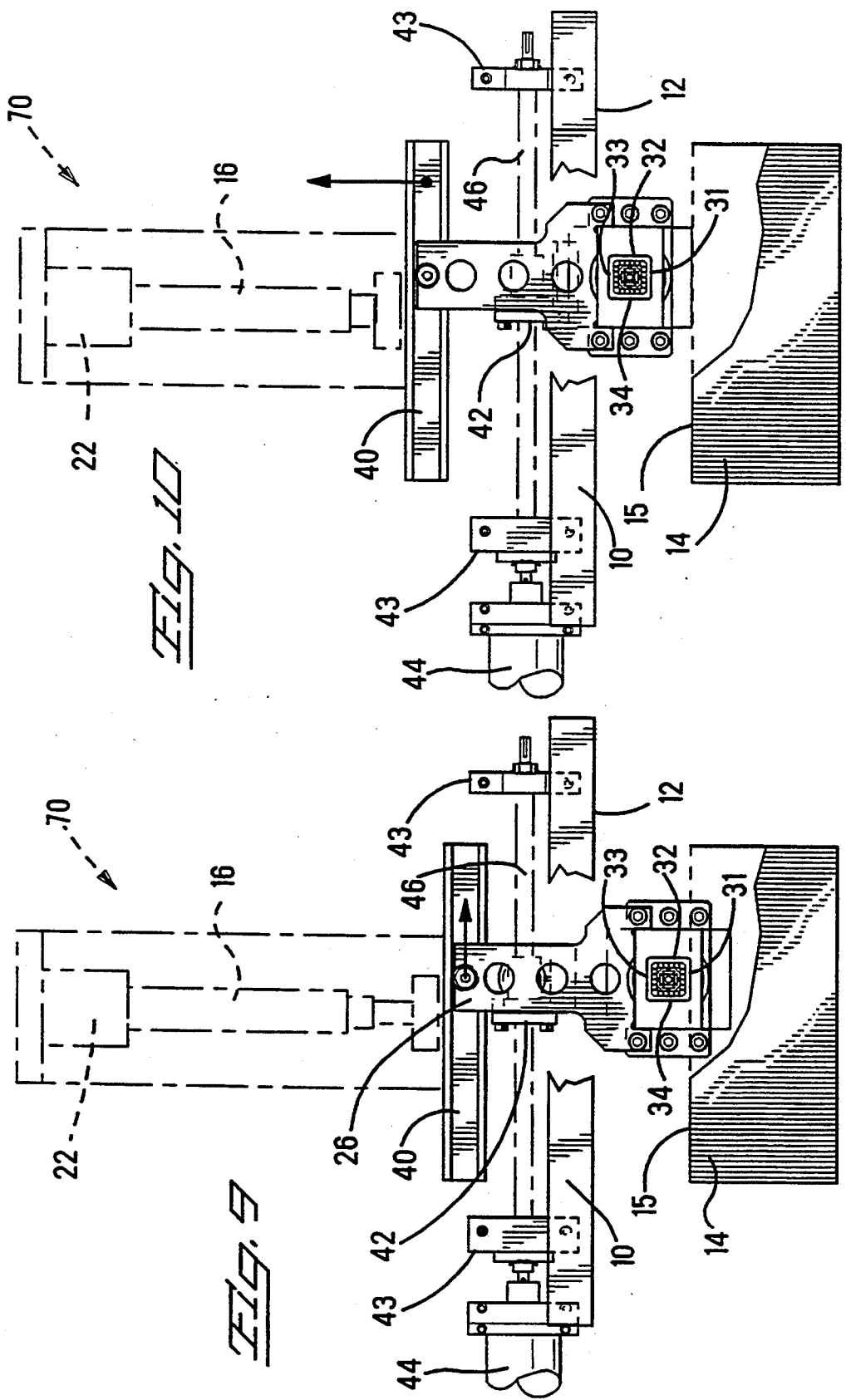

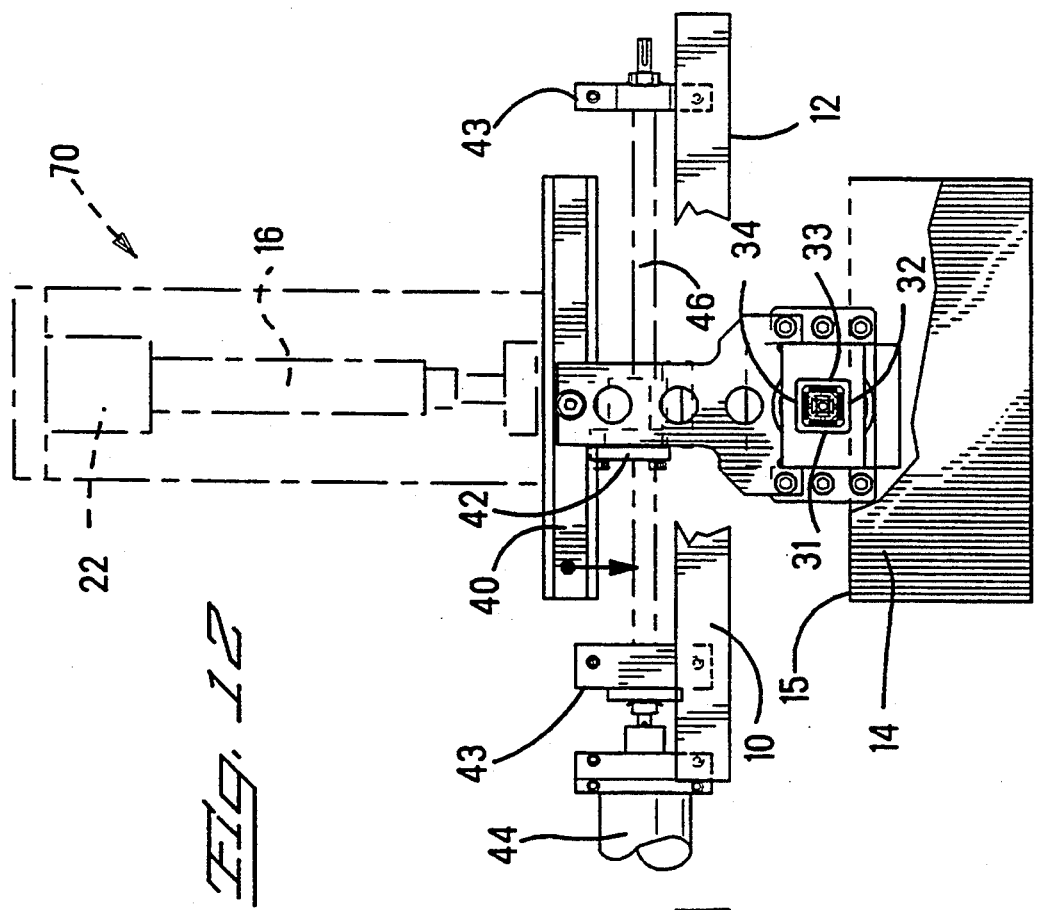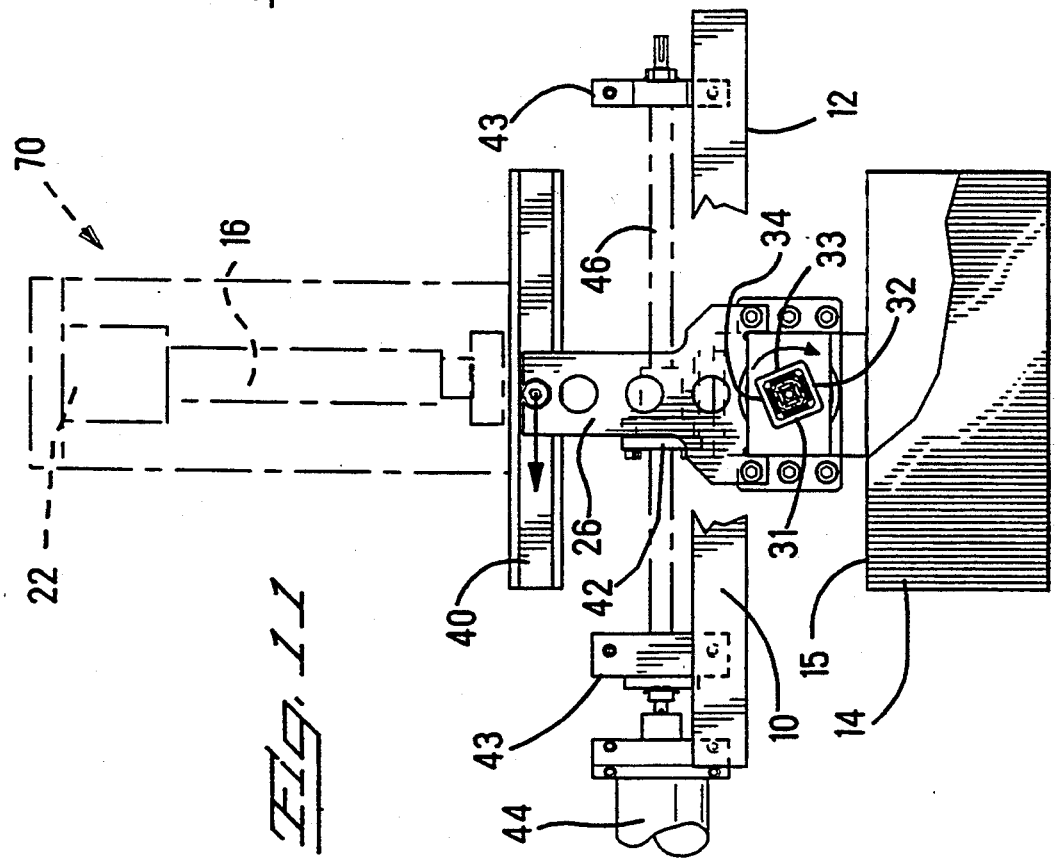

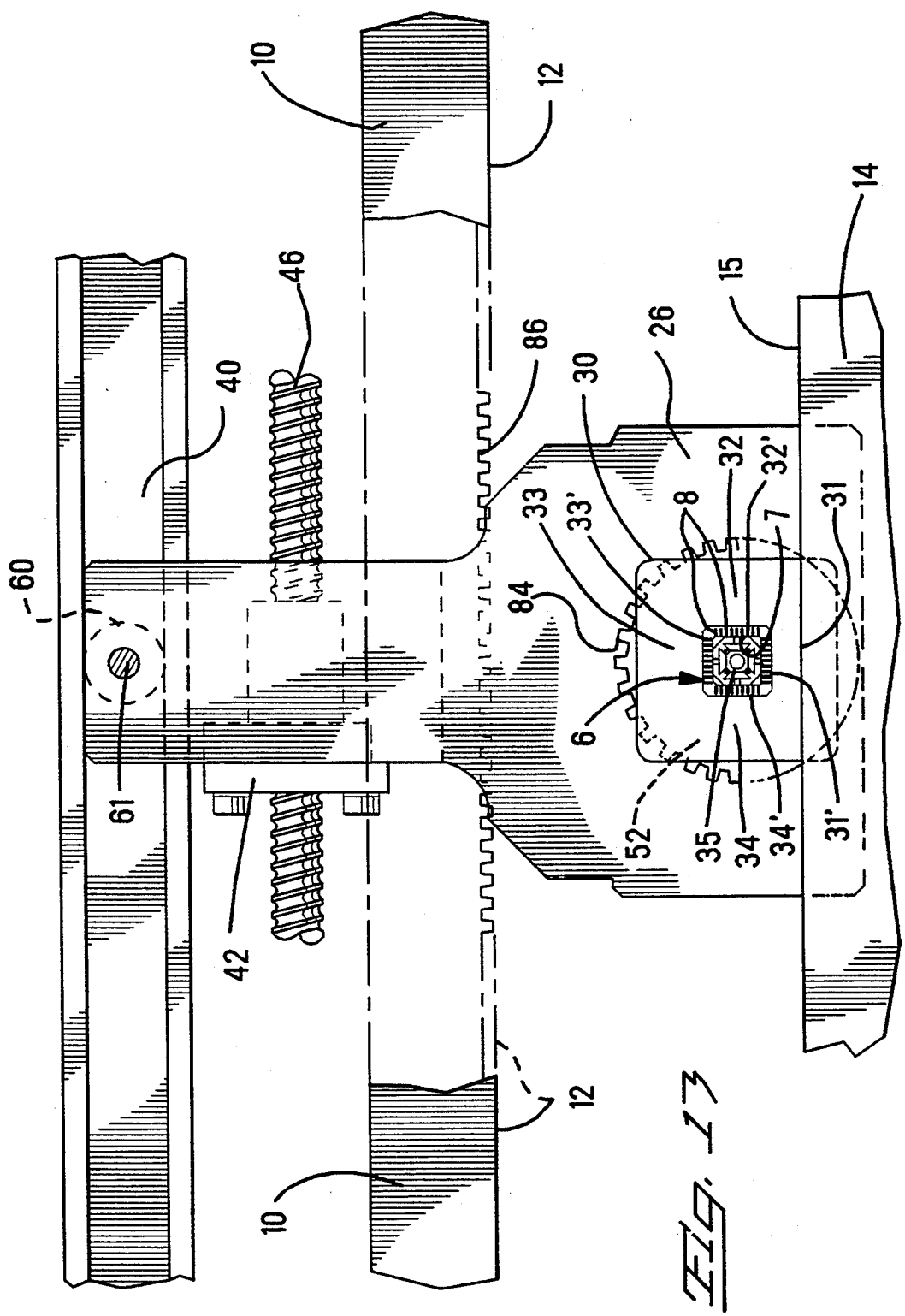

MECHANISM FOR ROTATING A WORKPIECE

FIELD OF THE INVENTION

The invention relates to a mechanism for rotating an element in a machine, and in particular, to a mechanism for rotating a mandrel which holds a workpiece to index the workpiece at different angular orientations with respect to a workstation of the machine.

BACKGROUND OF THE INVENTION

A socket for an electrical interconnection typically comprises a dielectric housing having a plurality of contacts disposed in an array therein. Automatic machines for stitching the contacts into apertures of the housing are well-known. Typically, such machines have a reciprocating insertion tool which successively inserts, or stitches, contacts into the housing as the housing is incrementally indexed past the reciprocating tool.

Plastic Leaded Chip Carrier (PLCC) sockets such as those sold by AMP Incorporated of Harrisburg, Pa. under part number 821977-1 comprise a rectangular plastic housing having contacts stitched in a row along each of its four sides. In order to stitch the contacts into the housing in an automatic stitching machine, the machine must move the housing to present each of the four sides successively to the insertion tool. One method of accomplishing this would be to nest the housing in a plane perpendicular to a reciprocation axis of the tool and to translate the housing in respective x- and y-directions so that an intersection of the reciprocation axis with the housing delineates a rectangular path along the sides of the housing. This method has the disadvantage that incremental indexing of the housing must be provided in both the x- and y-directions, thereby requiring two separate indexing mechanisms with attendant complexity and expense.

Another method of presenting the four sides of the housing successively to the insertion tool with the housing nested as above-described is to alternately translate a side of the housing past the insertion tool and then to rotate the housing ninety degrees whereupon a next side of the housing is translated past the insertion tool, and so on for all four sides. This method requires only one mechanism to incrementally index housing in the x-direction. Rotation of the housing can be accomplished by a motorized drive connected to rotate the nest, but this requires a motor controller or clutch to index the rotation at quarter turn intervals, and such a system is relatively complex and expensive. Alternatively, rotation can be accomplished by providing a pawl which presents an obstruction to linear movement of the housing and nest, thereby causing the housing and nest to ride up over the pawl in a rotary motion. This arrangement suffers from the drawback that rotation can only occur where a pawl is located along the path of the housing, and multiple pawls must be spaced a minimum distance apart. Further, the nest experiences an impact each time it strikes the pawl, and this limits the speed at which motion can occur. There is a need for a different rotation mechanism which is simple, effective, and versatile, which enables rotation of the nest anywhere along its path in selectable angular increments.

SUMMARY OF THE INVENTION

The invention provides a mechanism for rotating a machine element and is particularly adapted for rotating a mandrel which holds a workpiece in a machine. The mechanism comprises a first frame member having a substantially linear road surface. A machine element is rotatably secured to a carrier on an axis extending transverse to the road surface. The machine element includes a wheel member having a substantially circular wheel surface adapted to engage the road surface, and may include a mandrel adapted to hold the workpiece. A first drive mechanism is operable for moving the carrier and the first frame member relatively together for engagement of the wheel surface with the road surface, and for moving or at least permitting movement of the carrier and the first frame member relatively apart for disengagement of the wheel surface from the road surface. A second drive mechanism is operable to produce relative movement of the carrier parallel to the road surface. Actuation of the second drive mechanism when the road surface is engaged with the wheel surface causes rotation of the machine element, and thereby rotates a workpiece held in a mandrel of the machine element.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 9 is a front view showing the mandrel assembly engaged on a datum surface.

FIG. 10 is a front view showing a wheel surface of the mandrel assembly engaged with a road surface.

FIG. 11 is a front view showing translation of the carrier parallel to the road surface and rotation of the mandrel assembly.

FIG. 12 is a front view showing the mandrel assembly reengaged with the datum surface.

FIG. 13 is an enlarged front view of the rotation mechanism in an alternate embodiment.

DETAILED DESCRIPTION OF THE PREFERRED EMBODIMENT

Figure 1:
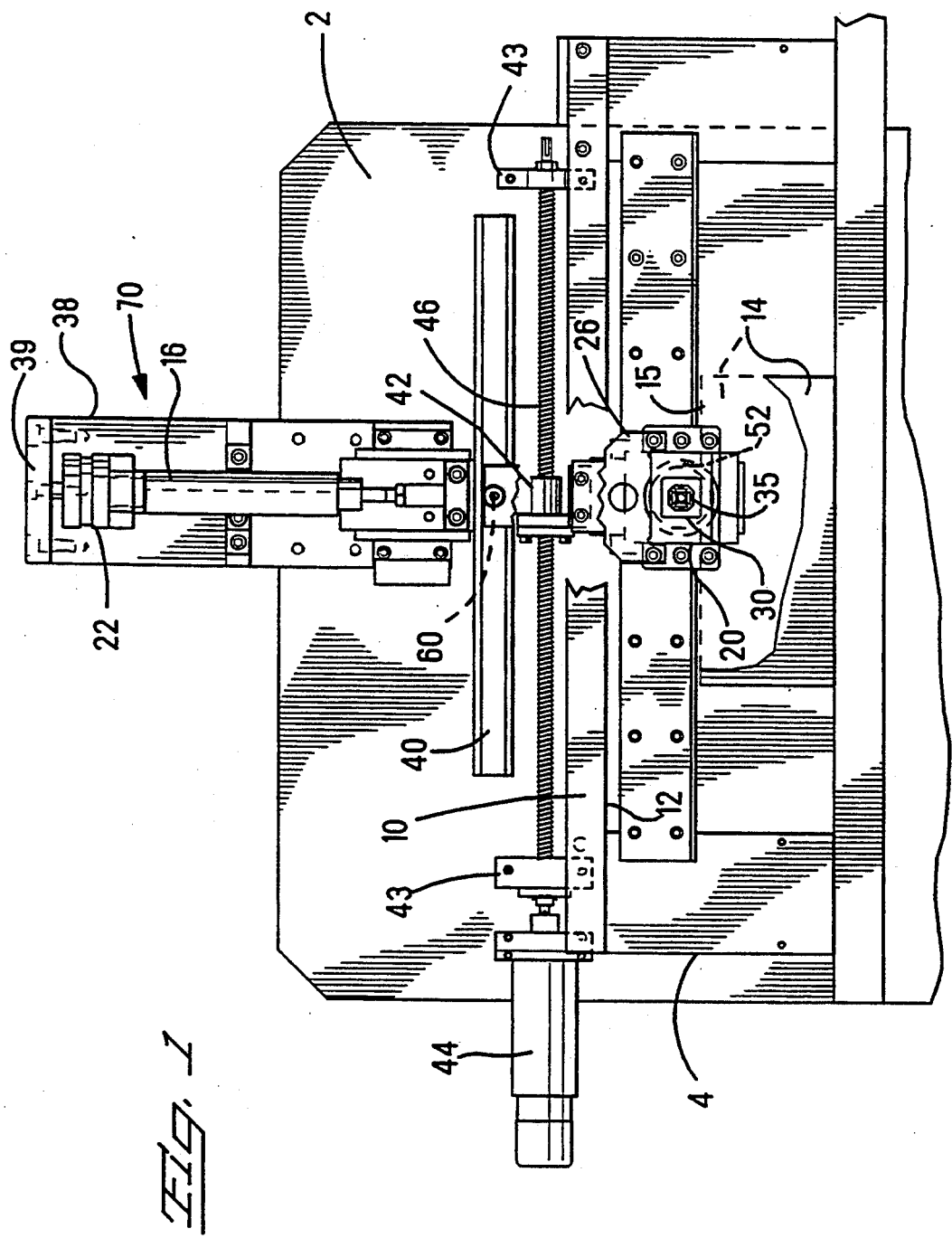
FIG. 1 is a front elevation view of a rotation mechanism according to the invention.

A mechanism according to the invention is useful in a machine having a translatable machine element which must be periodically rotated through a selected angular displacement during process operations. The mechanism enables selective rotation of the machine element at any location along a linear path of translation. The invention is particularly useful for rotating a machine element which includes a mandrel adapted to hold a workpiece or a nest for a workpiece, to enable the workpiece to be presented to a tool at different angular orientations.

As shown in FIGS. 1-4, the mechanism comprises a first frame member 10 which is supported between a pair of supports 4 which are connected to base member 5 of machine frame 2. The first frame member 10 has a substantially linear road surface 12 which, in a preferred embodiment, is defined by a smoothly machined face of the frame member 10.

Figure 2:
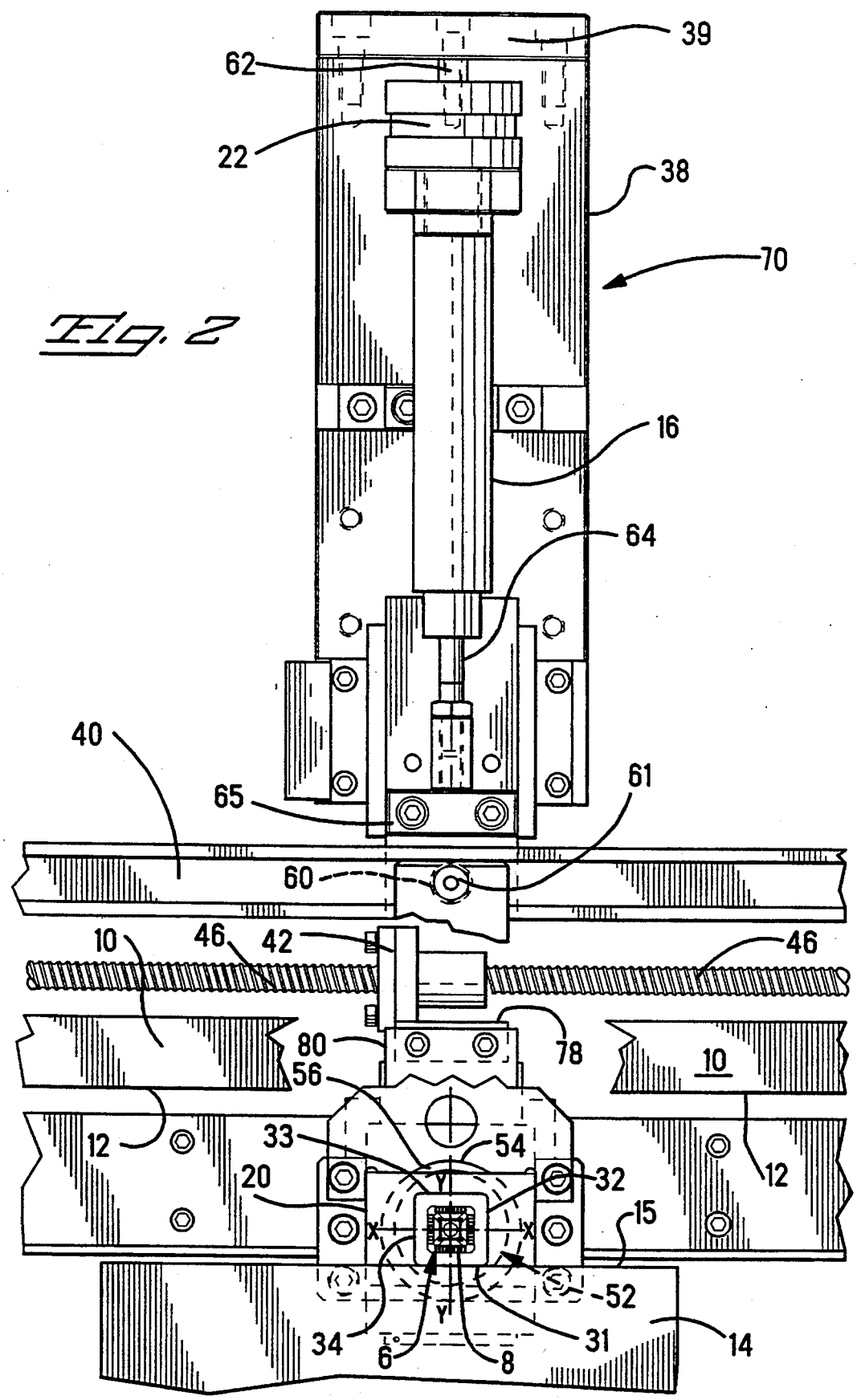
FIG. 2 is an enlarged view of the mechanism shown in a central portion of FIG. 1.
Figure 3:
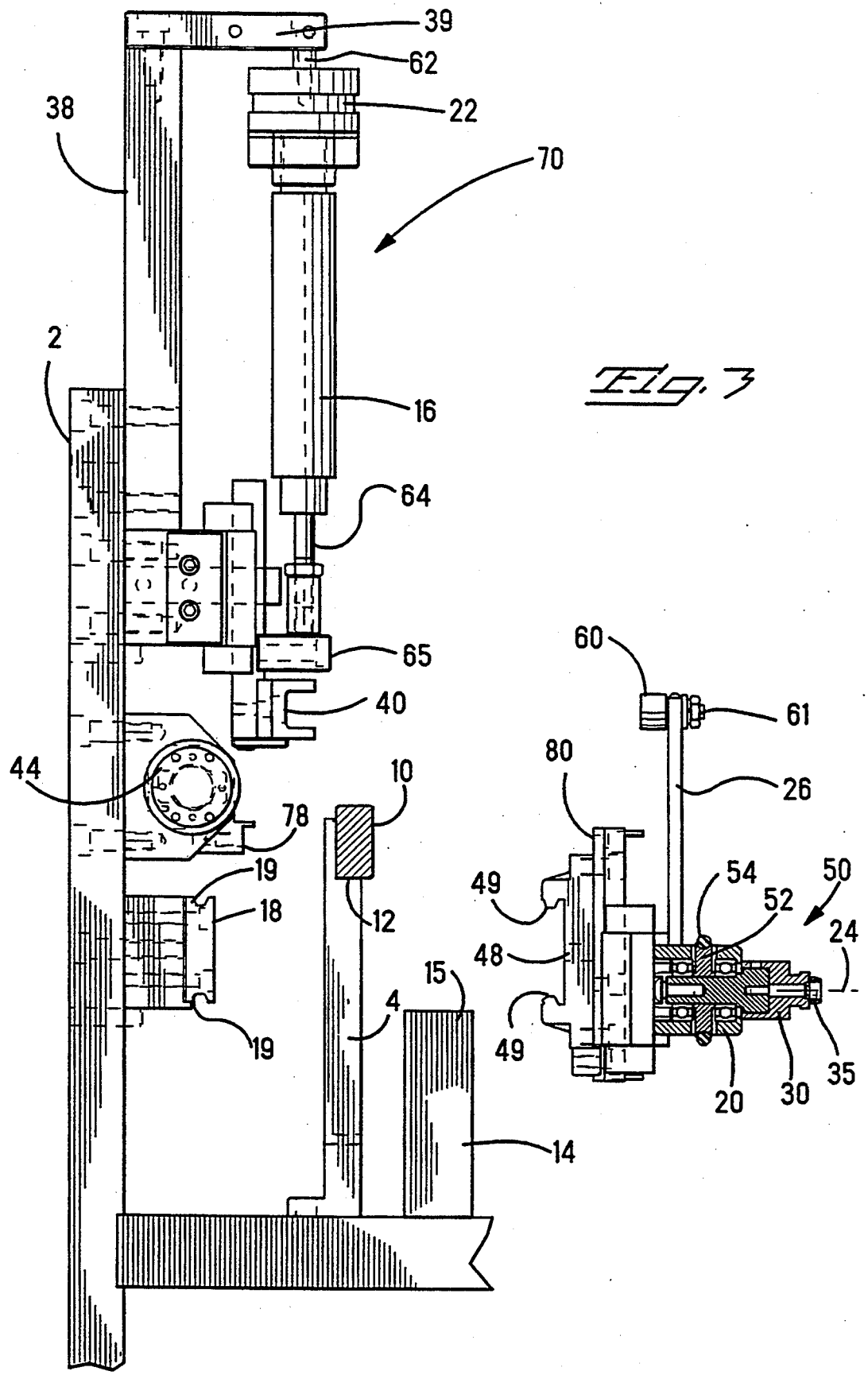
FIG. 3 is a side elevation view of the rotation mechanism showing a carrier and mandrel assembly separated from the machine.
Figure 4:
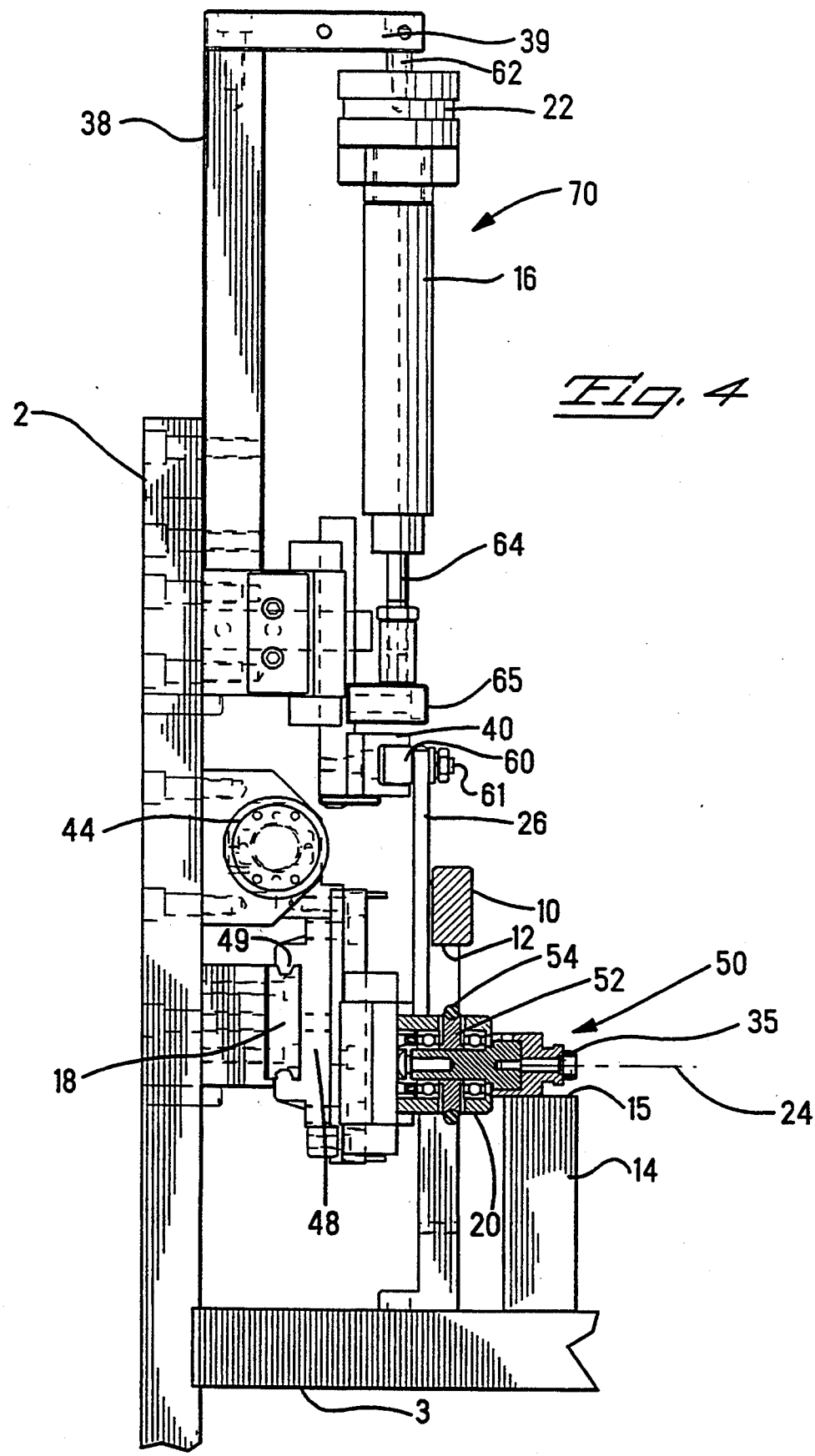
FIG. 4 is a side elevation view showing the carrier and mandrel assembly installed on the machine.

A carrier 20 is hung from the machine frame 2 by a carrier lift and support mechanism shown generally as 70 which will be more fully described hereinafter. The carrier 20 is connected for movement along mutually perpendicular axes shown as X—X and Y—Y in FIG. 2. The carrier 20 is constrained for linear movement along axis X—X by projections 49 of slide 48 which are engaged in channels 19 on opposite sides of rail 18, as best seen in FIG. 3.

A machine element shown generally by reference numeral 50 is rotatably secured to the carrier 20 on an axis 24. The machine element 50 includes a wheel member 52 having a substantially circular wheel surface 54 which is adapted to engage the road surface 12. In a preferred embodiment as shown in detail in FIG. 5, the wheel member 52 comprises an elastomeric O-ring 56 disposed annularly on a hub or pulley 58. In an alternate embodiment as shown in FIG. 13, the wheel member 52 may comprise a pinion having gear teeth 84 which are engageable with a toothed rack 86 defined by the road surface 12.

Figure 5:
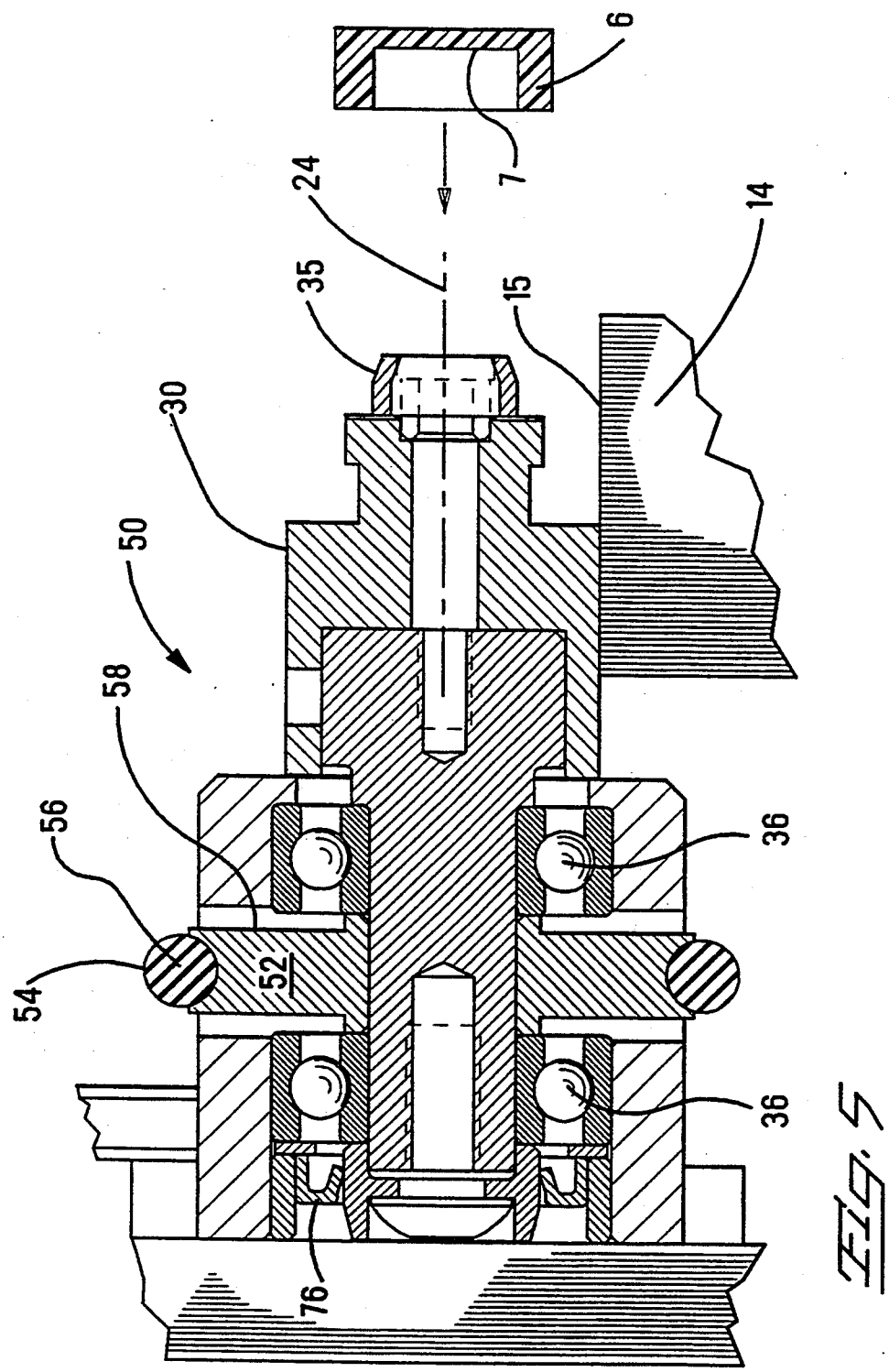
FIG. 5 is an enlarged cross-sectional view of the carrier and mandrel assembly.
Figure 6:
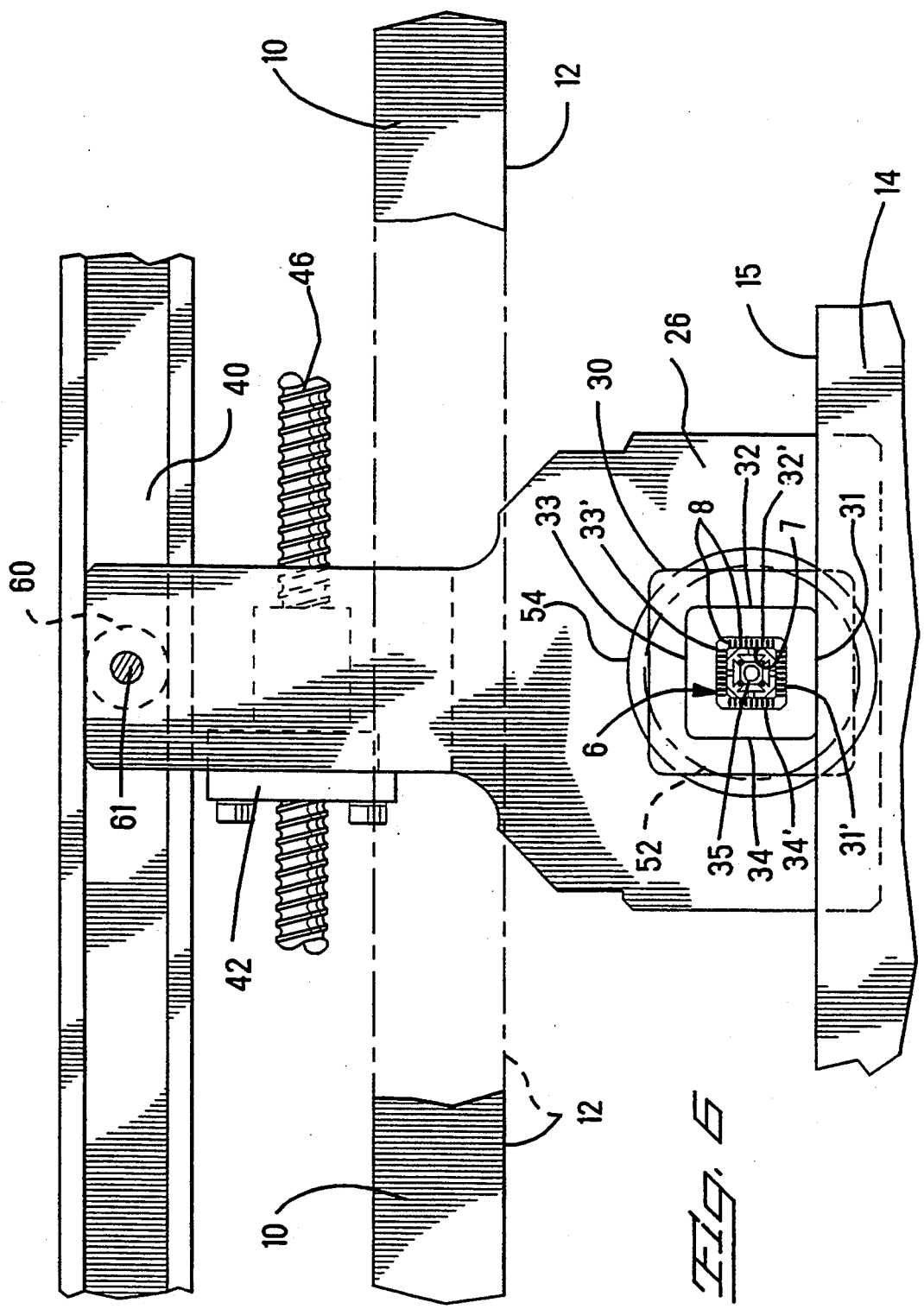
FIG. 6 is an enlarged front view of the rotation mechanism.

With reference to FIGS. 5 and 6, the rotation mechanism according to the invention may be used for rotating a workpiece such as Plastic Leaded Chip Carrier (PLCC) socket 6 which comprises a rectangular body having four rows of cavities 8 adapted to receive contacts therein. In order to rotate the socket 6, the machine element 50 comprises a mandrel assembly 30 including the wheel member 52 and a mandrel 35. The mandrel assembly 30 is journaled on bearings 36 in the carrier 20 and is rotatable on the axis 24 which extends through a center of the mandrel 35. The mandrel 35 is adapted to hold the socket 6 or other workpiece such as by a snug fit of the mandrel 35 in a hollow portion 7 of the socket 6 or other workpiece, or alternatively by a latch. The mandrel 35 could also be adapted to hold an article handling fixture such as that disclosed in copending patent application Ser. No. 08/078,532, which has been assigned to the same assignee as the present application.

Referring back to FIGS. 1-4, the carrier lift mechanism 70 includes a first drive means which is operable for moving the carrier 20 and the first frame member 10 relatively together for engagement of the wheel surface 54 with the road surface 12, and for moving or at least permitting movement of the carrier 20 and the first frame member 10 relatively apart for disengagement of the wheel surface 54 with the road surface 12. In a preferred embodiment shown in the drawings, the first drive means comprises two actuation cylinders 16 and 22. A rod 62 of the cylinder 22 is attached to cylinder mounting plate 39 which extends from fixed mounting plate 38 of the machine frame 2. The cylinder 22 has a relatively short stroke. The cylinder 16, which has a relatively longer stroke, is attached to the cylinder 22. Rod 64 of the cylinder 16 is coupled through drive block 65 to U-shaped channel 40. A bearing member 60 which is journaled for rotation on shaft 61 rides in the channel 40. The shaft 61 is secured to follower plate 26 which has the carrier 20 attached at its lower end. The cylinders 16 and 22 receive actuation forces through appropriate connections (not shown) with a source of, for example, pneumatic or hydraulic pressure, whereby the cylinders 16 and 22 are operable to lift the channel 40 and concurrently lift the carrier 20 and the machine element 50 to bring the wheel surface 54 into engagement with the road surface 12. The cylinder 16 is operable singularly to lift the carrier 20 to an intermediate position wherein the carrier 20 is above a datum surface but the wheel surface 54 remains disengaged from the road surface 12, as will be more fully described hereinafter.

Figure 7:
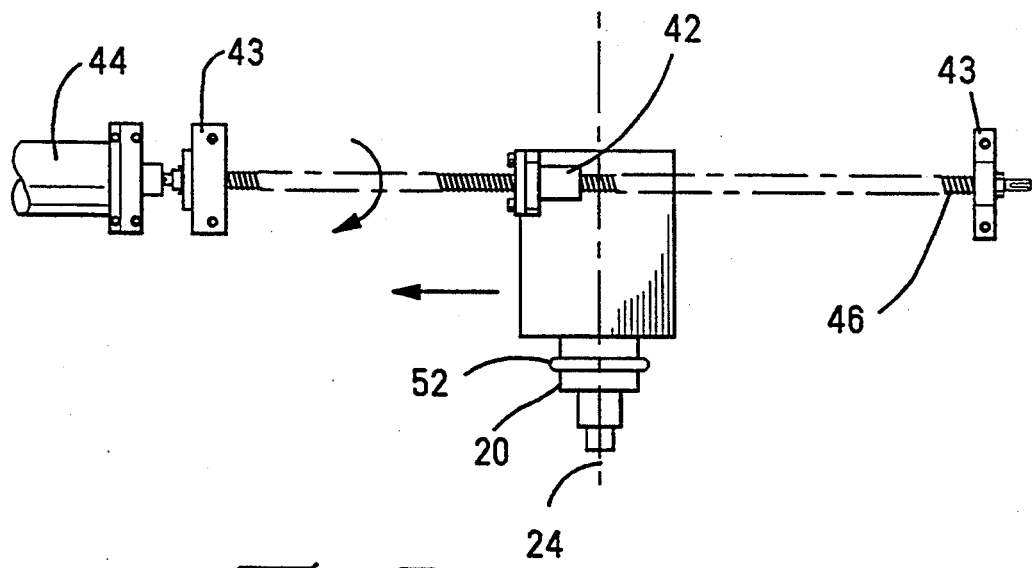
FIG. 7 is a top view of a drive mechanism for moving the carrier parallel to a road surface.
Figure 8:
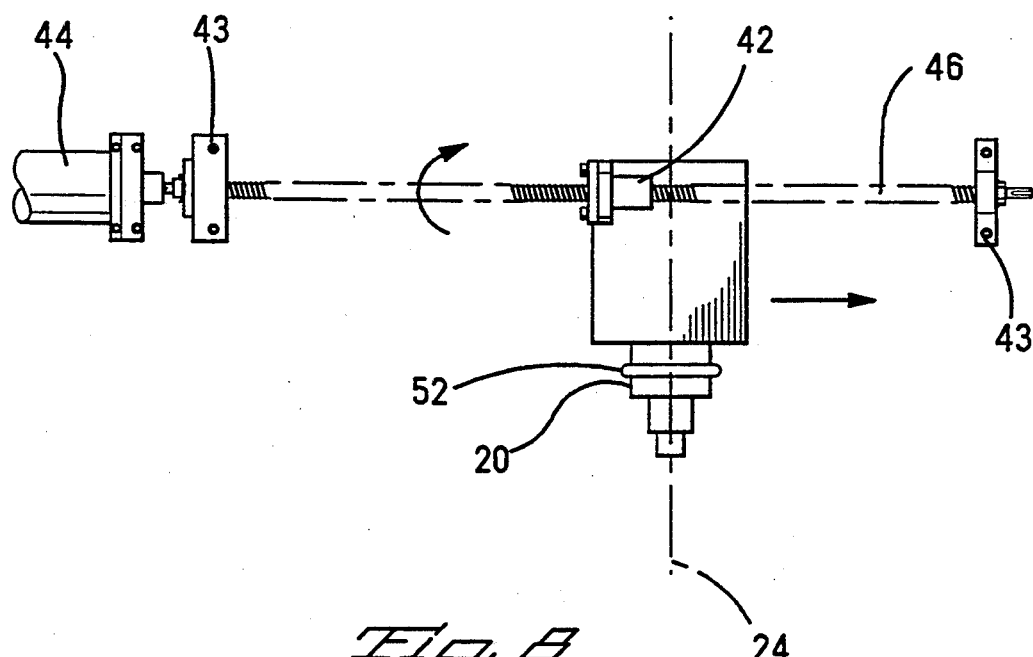
FIG. 8 is a top view similar to FIG. 7 showing the carrier having been moved to a different position.

A second drive means is operable to produce relative movement of the carrier 20 parallel to the road surface 12. In a preferred embodiment shown in the drawings, the second drive means includes a ball screw 46 which is rotatably mounted in bearing blocks 43. A motor 44 is coupled to one end of the ball screw 46. A ball nut 42 which is engaged on the ball screw 46 carries a mounting pad 78. The carrier 20 is attached to a mounting plate 80 which in turn is attached to the mounting pad 78. As shown in FIGS. 7 and 8, the motor 44 is operable to rotate the ball screw 46 in one direction or the other, whereby the ball nut 42 and the carrier 20 attached thereto are moved leftwardly or rightwardly along axis X—X, thereby moving the carrier 20 parallel to the road surface 12.

In an alternative embodiment, the motor 44 can be operably connected to rotate a capstan on an axis extending perpendicular to the axis X—X. A flexible cable has a mid-portion wrapped around the capstan, and ends of the cable are secured to end portions of a bracket which extends parallel to the axis X—X and is coupled to the carrier 20.

Referring again to FIGS. 1-4, the carrier 20 having the wheel member 52 is mounted beneath the road surface 12 with the axis 24 extending transverse to the road surface 12. When the cylinders 16 and 22 are retracted to raise the carrier 20 along axis Y—Y and engage the wheel surface 54 with the road surface 12, actuation of the second drive means to move the carrier 20 causes rotation of the machine element 50 about axis 24, thereby rotating a workpiece held on the mandrel 35. The machine element 50 will be rotated through one complete revolution as the carrier 20 is displaced linearly through a distance equal to the circumference of the wheel surface 54. Rotation of the machine element 50 can be accomplished in selected angular increments by displacing the carrier 20 through appropriately modified linear distances.

In order to linearly translate the carrier 20 without rotation of the machine element 50, the cylinders 16 and 22 are extended to move the carrier 20 downwardly so as to disengage the wheel surface 54 from the road surface 12. Preferably, the cylinders 16 and 2 are pressurized in an appropriate manner to move the rod 64 downwardly in a quick stroke so as to enable high speed machine movements in an automatic processing operation. Alternatively, the cylinders 16 and 22 could be merely depressurized so that the carrier 20 would be urged downwardly by gravity, or a spring could be added to urge the carrier downwardly with an additional force. In any event, with the wheel surface 54 disengaged from the road surface 12, the motor 44 can be operated to rotate the ball screw 46 and move the carrier 20 linearly without rotation of the machine element 50.

A means for angularly orienting the machine element 50 with respect to the carrier 20 and restraining the machine element against rotation during actuation of the second drive means may comprise a second frame member 14 which defines a substantially planar datum surface 15 extending parallel to and spaced apart from the road surface 12. The machine element 50 has at least one planar surface extending parallel to the axis 24, as shown in FIG. 2 by exemplary planar surfaces 31, 32, 33 and 34 of the mandrel assembly 30. Actuation of the cylinders 16 and 22 to move the carrier 20 downwardly causes one of the planar surfaces 31, 32, 33, 34 to bear against the datum surface 15, thereby orienting the mandrel assembly 30. This orientation feature overcomes any adverse effects due to slippage at the interface of the wheel surface 54 and the road surface 12. Further, by urging the mandrel assembly 30 against the datum surface 15, the mandrel assembly 30 is restrained against rotation when the carrier 20 is moved along the X—X axis. This restraining feature permits the carrier 20 to be translated in order to move the socket 6 past a contact stitching head for inserting contacts in a row into the cavities 8 along a lowermost side of the socket.

It should be noted that the mandrel assembly 30 has the same number of planar surfaces 31, 32, 33, 34 as the number of sides of the socket 6 or other workpiece. For the embodiment shown in FIG. 6, the four planar surfaces 31, 32, 33, 34 are associated with four side surfaces 31', 32', 33', 34' of the socket 6, respectively. It should also be noted that the planar surfaces are spaced equidistant from their associated socket side surfaces.

A full cycle of the rotation mechanism as used in a contact stitching machine will now be described with reference to FIGS. 9-12. FIG. 9 illustrates the planar surface 31 being engaged on the datum surface 15 and the carrier 20 being translated linearly to the right to move the socket 6 past an insertion head. During this translation, an automatic controller governs operation of the motor 44 so as to provide a stepping action which moves the carrier 20 in discrete increments between adjacent ones of the cavities 8 in the lowermost row of cavities, thereby enabling insertion of contacts in each of the cavities in the lowermost row. In the illustrated example, the carrier 20 is moved in equal increments because the cavities 8 along each row of the socket are equally spaced apart, but the carrier could be moved in unequal increments, for example, to skip certain ones of the cavities or to insert the contacts in special patterns.

When insertion of contacts in the lowermost row of cavities is completed, the cylinders 16 and 22 are retracted to lift the channel member 40 as shown in FIG. 10, thereby engaging the wheel surface 54 with the road surface 12. Referring to FIG. 11, the motor 44 is then actuated to translate the carrier 20 to the left a distance equal to one-quarter of the circumference of the wheel surface 54, whereby the mandrel assembly which holds the socket 6 is rotated one-quarter of a turn to bring a next row of the cavities 8 into a lowermost position. The cylinders 16 and 22 are then extended to lower the carrier 20 and to engage the next planar surface 32 with the datum surface 15, as shown in FIG. 12, thereby aligning the socket side surface 32' angularly and in the Y—Y direction. It may then be necessary to translate the carrier 20 some distance to the left or right to align the first cavity in the lowermost row of cavities with the insertion head. After the alignment, the stitching of contacts into the lowermost row of cavities is repeated. Upon stitching of contacts into all four rows of the cavities 8, the motor 44 is actuated with the wheel surface disengaged from the road surface to move the mandrel to a socket transfer station wherein a finished socket is removed from the mandrel and a new socket is inserted thereon.

When the cylinder 22 is extended and the cylinder 16 is retracted, the carrier 20 disposed in an intermediate position wherein the at least one planar surface 31, 32, 33, 34 is disengaged from the datum surface 15, and the wheel surface 54 is disengaged from the road surface 12. In the intermediate position, the carrier 20 can be translated without rotation of the wheel member 52, such as may be necessary for the carrier to clear tooling, for example. In order to prevent inadvertent rotation of the wheel member 52 when the carrier 20 is in the intermediate position, a drag member may be provided, such as spring seal 76, as shown in FIG. 5, or other spring biasing member. Similarly, a detent mechanism arranged to provide detent positions corresponding to selected angular orientations of the wheel member 52 could serve the same purpose.

The invention having been disclosed, a number of variations will now become apparent to those skilled in the art. For example, although the invention has been described in detail as having the first frame member 10 and road surface 12 being fixed and the carrier 20 and wheel member 52 being movable with respect thereto, it will now become apparent to those skilled in the art that objects of the invention could be accomplished by various other movements that would provide equivalent relative displacements of the wheel member with respect to the road surface, and all such variations are considered to be within the scope of the invention. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. Mechanism for rotating a workpiece in a machine, comprising:
   a first frame member having a substantially linear road surface;
   a carrier;
   a mandrel assembly rotatably secured to the carrier on an axis extending transverse to the road surface, the mandrel assembly including a wheel member having a substantially circular wheel surface adapted to engage the road surface, and a mandrel adapted to hold the workpiece;
   a first drive means operable for moving the carrier and the first frame member relatively together for engagement of the wheel surface with the road surface, and for moving or at least permitting movement of the carrier and the first frame member relatively apart for disengagement of the wheel surface from the road surface; and,
   a second drive means operable to produce relative movement of the carrier parallel to the road surface;
   wherein actuation of the second drive means when the wheel surface is engaged with the road surface causes rotation of the mandrel assembly, thereby rotating a workpiece held in the mandrel.

2. The mechanism according to claim 1, wherein the wheel member is disposed beneath the road surface.

3. The mechanism according to claim 1, wherein the wheel member comprises an O-ring disposed annularly on a wheel.

4. The mechanism according to claim 1, wherein the wheel surface frictionally engages the road surface.

5. The mechanism according to claim 1, wherein the wheel member comprises a pinion gear, and the road surface defines a toothed rack engageable by the pinion gear.

6. The mechanism according to claim 1, wherein the axis of the mandrel assembly extends through a center of the mandrel.

7. The mechanism according to claim 1, further comprising a second frame member having a substantially planar datum surface extending parallel to and spaced apart from the road surface, and the mandrel assembly having at least one planar surface extending parallel to the axis, wherein operation of the first drive means to move the carrier and the first frame member relatively apart causes the at least one planar surface to bear against the datum surface, thereby angularly orienting the mandrel assembly with respect to the carrier and restraining the mandrel assembly against rotation during actuation of the second drive means.

8. The mechanism according to claim 7, wherein the wheel member is disposed beneath the road surface, and the at least one planar surface is urged against the datum surface by gravity.

9. The mechanism according to claim 7, wherein the second drive means is operable to move the carrier to an intermediate position wherein the wheel surface is disengaged from the road surface and the at least one planar surface is disengaged from the datum surface.

10. The mechanism according to claim 9, further comprising a drag member biased against the mandrel assembly to resist rotation of the mandrel assembly when the carrier is in the intermediate position.

11. The mechanism according to claim 10, wherein the drag member comprises a spring seal.

12. Mechanism for rotating a machine element, comprising:
a first frame member having a linear road surface;
a carrier;
a machine element rotatably secured to the carrier on an axis extending transverse to the road surface, the machine element including a wheel member having a substantially circular wheel surface adapted to engage the road surface;
a first drive means operable for moving the carrier and the first frame member relatively together for engagement of the wheel surface with the road surface, and operable to move or at least permit movement of the carrier and the first frame member relativley apart for disengagement of the wheel surface from the road surface; and,
a second drive means operable to produce relative movement of the carrier parallel to the road surface;
wherein actuation of the second drive means when the wheel surface is engaged with the road surface causes rotation of the machine element.

13. The mechanism according to claim 12, further comprising a second frame member having a substantially planar datum surface extending parallel to and spaced apart from the road surface, the machine element having at least one planar surface extending parallel to the axis, wherein operation of the first drive means to move the carrier and the first frame merrier relatively apart causes the at least one planar surface to bear against the datum surface, thereby angularly orienting the machine element with respect to the carrier and restraining the machine element against rotation during actuationof the second drive means.

14. The mechanism according to claim 12, wherein the wheel member is disposed beneath the road surface, and the at least one planar surface is urged against the datum surface by gravity.

* * * * *